United States Patent [19]
Tait et al.

[11] Patent Number: 5,492,722
[45] Date of Patent: Feb. 20, 1996

[54] PROCESS AND APPARATUS FOR RESIN IMPREGNATION OF A FIBROUS SUBSTRATE

[75] Inventors: Robert A. Tait, Houston, Tex.; Walter R. Stelling, Milwaukee, Wis.; John J. Hartley, Pewaukee, Wis.; Donald M. Chevako, Milwaukee, Wis.

[73] Assignee: Shell Oil Company, Houston, Tex.

[21] Appl. No.: 248,841

[22] Filed: May 25, 1994

Related U.S. Application Data

[63] Continuation of Ser. No. 982,264, Nov. 25, 1992, abandoned, which is a continuation of Ser. No. 796,882, Nov. 25, 1991, which is a continuation of Ser. No. 583,119, Sep. 17, 1990, abandoned.

[51] Int. Cl.$^6$ ........................................ B05D 1/00
[52] U.S. Cl. .................. 427/211; 427/389.8; 427/428
[58] Field of Search ................................ 427/428, 208, 427/388.5, 389.8, 211

[56] References Cited

U.S. PATENT DOCUMENTS

| | | | |
|---|---|---|---|
| 3,826,703 | 7/1974 | Russell | 161/210 |
| 3,881,445 | 5/1975 | Nothinger | 118/4 |
| 4,139,591 | 2/1979 | Jurisich | 264/257 |
| 4,185,133 | 1/1980 | Woerner | 427/209 |
| 4,327,143 | 4/1982 | Alvino | 428/236 |
| 4,767,643 | 8/1988 | Westervelt | 427/54.1 |
| 4,774,107 | 9/1988 | Kwiatkowski et al. | 427/428 |
| 4,804,509 | 2/1989 | Angell | 264/136 |
| 4,886,684 | 12/1989 | Schnell et al. | 427/389.9 |

FOREIGN PATENT DOCUMENTS

| | | | |
|---|---|---|---|
| 476752 | 3/1992 | European Pat. Off. | B29B 15/12 |
| 3344990 | 6/1985 | Germany . | |
| 3511419 | 10/1986 | Germany | 427/428 |

OTHER PUBLICATIONS

Encyclopedia of Chemical Technology, 3rd Ed., "Coating Processes," pp. 386–426 (no date).
"Formulating with Dow Epoxy Resins: Electrical Laminates," Dow Chemical Company (1990). (no mo.).

*Primary Examiner*—Janyce Bell

[57] ABSTRACT

Apparatus and process are described for impregnating a fibrous substrate with a thermosettable resin. The process involves the use of resin application means comprising a moving surface on which is positioned a liquid-form thermosettable resin in essentially uncured state, passing a fibrous web in countercurrent contact with the thermosettable resin so as to transfer the thermosettable resin into the fibrous web, and passing the resin-containing fibrous web to a heating zone to partially cure the resin and form a prepreg. The process is particularly suited for application of a solventless resin formulation to a glass web in the preparation of a prepreg for an electrical laminate. The apparatus includes resin application means comprising a movable surface; means for applying a liquid-form thermosettable resin onto the movable surface; means for advancing, in a countercurrent direction with respect to the direction of motion of the movable surface, a fibrous web to the movable surface and in contact with the thermosettable resin thereon and thence to a resin cure zone; and means not in contact with the opposite side of the fibrous web at the point of resin transfer for maintaining tension in the glass web sufficient to promote transfer of the liquid resin film from the movable surface into the interior of the glass web.

16 Claims, 2 Drawing Sheets

PROCESS AND APPARATUS FOR RESIN IMPREGNATION OF A FIBROUS SUBSTRATE

This is a continuation of application Ser. No. 07/982,264, filed Nov. 25, 1992, which is a continuation of application Ser. No. 07/796,882, filed Nov. 25, 1991, which is a continuation of application Ser. No. 07/583,119, filed Sep. 17, 1990, now abandoned.

BACKGROUND OF THE INVENTION

This invention relates to the preparation of fiber-reinforced thermosettable resin articles. In a specific embodiment, the invention relates to a process and apparatus for impregnation of a glass substrate with a solventless thermosettable resin system.

The manufacture of the cured thermosettable resin base of an electronic circuit board begins with the impregnation of a fibrous glass substrate with a liquid thermosettable resin system. The resin-impregnated substrate is then partially cured to form a "prepreg." A set of layered prepregs is then heated under pressure to fully cure the resin and to form a hard laminate, which serves as the base for electric circuitry.

Although there exist thermosettable resins, such as low molecular weight epoxy resins, which are liquid at room temperature, current circuit board requirements make it necessary to use high-performance resins systems which are solids or viscous liquids at room temperature and to apply the resins to the substrate in melt or solution form. Attempts to process thermosettable resins in the melt, however, have not been successful because of the difficulty of achieving good "wet-out," or saturation of the fiber by the resin, and also because the high temperatures necessary to melt the resin cause the resin to cure prematurely, further adding to the wet-out problem.

Current commercial processes for preparing prepregs apply the resin to the substrate using an organic solution of the resin. Solution processes must include a step, usually carried out in conjunction with partial curing of the resin, in which the solvent is removed from the prepreg by heating the solvent to its volatilization temperature. Such a process has a number of disadvantages: First, it requires the disposal or discharge of the organic volatiles. Second, volatilization of the solvent from the uncured resin can result in the presence of voids and irregularities in the prepreg and in the cured laminate. Furthermore, a considerable amount of time is required for the solvent removal step. A method for applying resin to the substrate which did not require solvents would thus have environmental, quality and efficiency advantages.

Processes for applying liquid-form resins to the substrate include passing the substrate through a resin bath, as illustrated in U.S. Pat. No. 4,767,643, and coating a non-porous release sheet with liquid resin and then pressing the release film against the porous substrate to transfer the resin thereto, as described in U.S. Pat. No. 4,139,591. The former technique suffers from problems associated with the tendency of resin in the reservoir to "advance," or partially cure, if it is not immediately taken up by the substrate, and the latter method suffers from the inconvenience and expense of processing the release sheet. It would be desirable to develop techniques for resins application which do not involve the use of a resin bath or a release sheet.

It is therefore an object of the invention to provide a process and apparatus for impregnating a fibrous substrate with a thermosettable resin. In a specific aspect, it is an object of the invention to provide a process and apparatus for impregnation of a fibrous glass substrate with a solventless thermosettable resin system.

SUMMARY OF THE INVENTION

Figure 3:
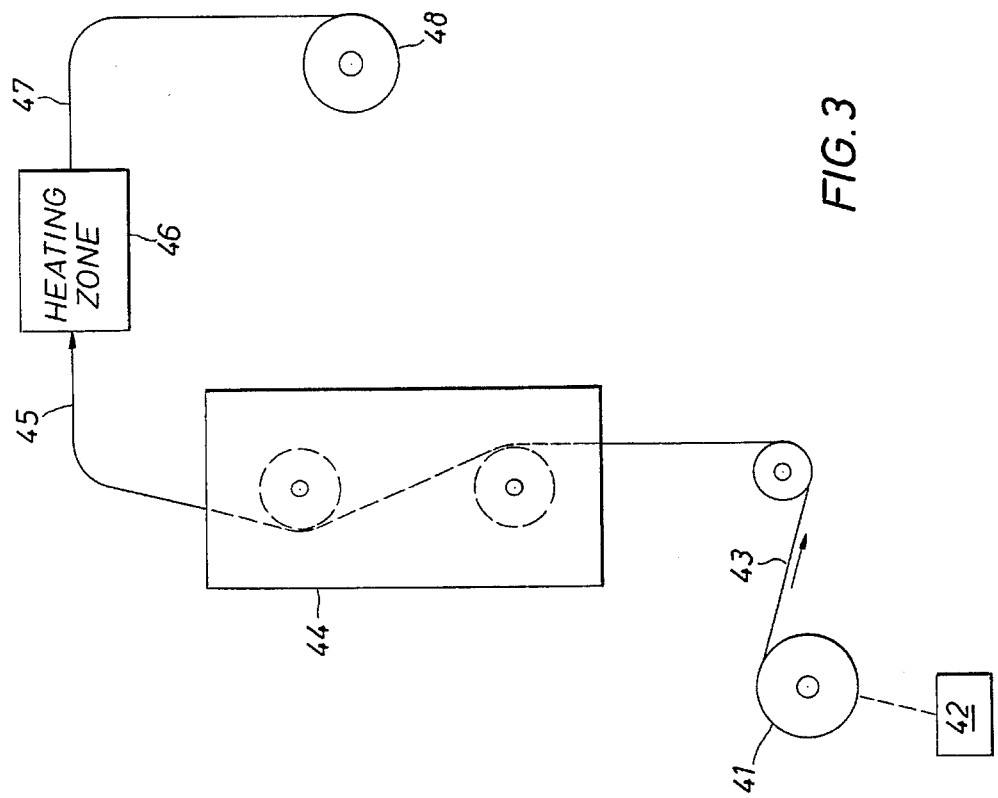
FIG. 3 is a flow diagram of a prepregging process incorporating the invention resin application apparatus.

According to the invention, a process is provided for impregnating a fibrous substrate with a thermosettable resin, the process comprising: providing resin application means comprising a moving surface; positioning on the moving surface a liquid-form thermosettable resin formulation comprising an essentially uncured thermosettable resin; passing a porous web in countercurrent contact with the thermosettable resin formulation on the moving surface so as to transfer the thermosettable resin formulation into the fibrous web; and passing the resin-containing fibrous web to a heating zone to partially cure the resin and form a prepreg comprising the fibrous substrate and the partially-cured thermosettable resin.

Further according to the invention, apparatus is provided for impregnating a porous web with a thermosettable resin, the apparatus including resin application means comprising a movable surface; means for applying a liquid-form thermosettable resin onto the movable surface; means for advancing, in a countercurrent direction with respect to the direction of movement of the movable surface, a porous web to the movable surface and in contact with the thermosettable resin thereon and thence to a resin cure zone; and means not in contact with the opposite side of the porous web at the point of resin transfer for maintaining tension in the web sufficient to promote transfer of the liquid resin film from the movable surface into the interior of the web.

DETAILED DESCRIPTION OF THE INVENTION

The invention process provides a technique for impregnating a fibrous substrate with a liquid-form thermosettable resin. The process is particularly suitable for impregnating a glass web with a solventless resin system in the preparation of a prepreg for ultimate use in electrical laminates.

The process involves contacting an advancing fibrous substrate with a liquid-form resin positioned on a moving surface and transferring, by countercurrent contact, the resin from the moving surface to the fibrous substrate and into the interior thereof. As used herein, such a fiber application process involves impregnating the resin into the interior of the fibrous substrate and is to be distinguished from coating only the exterior surface of the substrate. The object of the resin application process of the invention is to achieve thorough wet-out of the substrate by the liquid resin and to thereby permit the fabrication of a high-quality cured laminate from the resin-impregnated fibrous substrate.

In the invention resin application process, a fibrous substrate is impregnated with a liquid-form thermosettable resin. Although the invention process can be practiced with solvent-borne resins, the preferred resin system for the invention process is one which does not contain an organic solvent, which includes both water-borne resin systems and solventless resin systems. For a solventless resin system, the liquid form can be achieved by use of a thermosettable resin which is a low-viscosity liquid at room temperature or which has been heated to a temperature effective to achieve sufficiently low viscosity for thorough wetout of the substrate. In the latter case, of course, the resin system (the thermosettable resin and any curing compounds used therewith) must not cure to any substantial degree at its melting temperature over the length of time of the substrate impregnation process.

Figure 1:
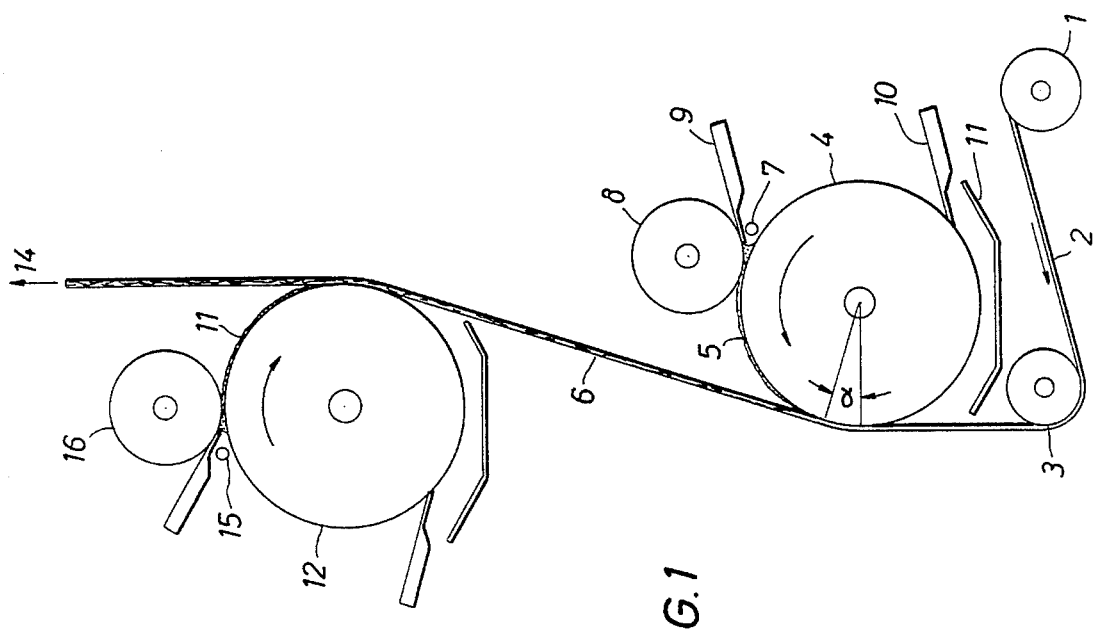
FIG. 1 is a cross-sectional diagram of the preferred embodiment of the invention resin application apparatus.

The invention resin application process and apparatus can be described by reference to FIG. 1. The substrate 2 in web form, generally any porous material in chopped, mat or woven form, preferably a web of woven glass fibers, is advanced from delivery means 1, which will generally include automatic means for advancing the web at a selected rate and with a selected web tension. The fibrous web is optionally heated by, for example, infrared heaters, prior to advancement to the resin application zone. Guiding means 3 is positioned to direct the web toward resin applicator roll 4 at a predetermined arc of contact α. Angle α can vary depending upon the overall configuration of the application scheme, but will generally be within the range of about 20 to about 90 degrees, preferably about 20 to about 40 degrees, most preferably about 25 to 34 degrees in the applicator embodiment shown. Resin application means 4, which can be, for example, an endless belt or a roller and is shown here as a roller rotating in a counterclockwise direction, delivers liquid resin film 5 to a first surface of web 2 passing counterdirectional thereto. Applicator roll 4 is maintained at a temperature effective to keep resin film 5 in essentially uncured, liquid form. This temperature will vary depending upon the resin, but will generally be within the range of about 50° to about 200° C. The speed of rotation of applicator roll 4, the tension in web 2 as it contacts resin film 5, and the speed at which web 2 is advanced to the applicator roll are coordinated to provide good wetout of the web. These specifications can vary widely depending, for example, upon the resin system, the type of web material, and the heating capacity of the downstream B-staging unit. In general, the speed of rotation of applicator roll 4 will be within the range of about 70 to about 125 percent of web speed, preferably about 90 to about 100 percent of web speed; the tension in web 2 will generally be within the range of about 1 to about 3 pounds per linear inch, preferably about 1.5 to about 2 PLI; and the speed of advancement of the web through the resin application zone will be within the range of about 8 ft/min to about 200 ft/min, preferably 50 to about 150 ft/min.

Resin film 5 is applied to applicator roll 4 by means of resin delivery means, shown here as a combination of set gap roll 8 and nozzle 7 capable of applying a controlled quantity of liquid resin to the rotating surface of the applicator roll. Nozzle 7, represented here in cross-section, can be a tube the axis of which is parallel to the length of the roll, having one or more exit ports for application of the liquid resin system to the roll. Blade 9, located closely adjacent the area of resin application to roll 4 and in contact with set gap roll 8, can be used to prevent movement of newly-deposited resin on the surface of roller 8 as it rotates and to define a small well or bead of active resin in the set gap area. Nozzle 7 can be associated with any means for continuous delivery of the resin in liquid form, at either ambient or elevated temperature. Delivery of the resin will be carried out at volume rates synchronized with the speed of the moving web so as to deliver a predetermined volume of resin to the web and to minimize residence time within the resin delivery system. Resin delivery means can include, for example, a temperature-controlled static blender or a mixing extruder with an outlet into nozzle 7.

Metering means, shown here as a set gap roller 8 located between nozzle 7 and the point of contact of resin film 5 and the advancing web, is used, in conjunction with resin delivery means 7, to control the amount of liquid resin which is delivered to the web. Set gap roll 8 is preferably a smaller-diameter roll than applicator roll 4 so as to permit a generally vertical alignment of the set gap roll and the applicator roll and to minimize residence time of the liquid resin prior to application to the web. Control of the rate at which resin is applied to the web is achieved in the first instance by careful setting of the gap between set gap roll 8 and applicator roll 4 so as to maintain a uniform film thickness 5. Secondly, the rotational speed of the applicator roll is coordinated with web speed so as to achieve transfer of the resin film onto the moving web. In addition, because no backup roll is employed to control the contact of the moving web with the applicator roll, control of web tension is maintained to ensure stable operation of the resin application process.

Resin removal means 10, shown here as a scraper blade located above discard trough 11, serves to remove from the applicator roll any resin which remains on the roll after contact between resin film 5 and advancing web 2, as any resin which has remained on the roll for a complete rotation is likely to have undergone excessive cure for application to the web.

Resin-containing web 6 is advanced to optional second resin application means 12, shown here as a roller rotating in a direction counter to that of first roller 4. Second roller 12 can be used to smooth the second surface of the resin-impregnated web and can, if required, serve the optional function of applying additional liquid-form resin 11 to the web as desired to increase prepreg resin content. This second roller can optionally be heated. In the embodiment shown, liquid resin, the quantity of which is controlled by nozzle 15 and set gap roll 13, is applied to resin-containing web 6 to increase the resin content of the web and to fill in any interstices or voids in the resin-containing web. Roller 12 can serve the additional (or alternate, if no resin is applied to the web at this point) function of smoothing the resin on the surface of the web as the web is advanced toward cure zone 14. It is preferable to pass the resin-saturated web directly to the cure zone without cooling thereof by cooling means such as chilled rollers, for example.

Second application means 12 is positioned between first application means 4 and cure zone 14. The web travel distance between the applicators can vary depending upon the other process variables, including the resin formulation, web porosity and web speed, but this distance will generally be within the range of about 1 to about 5 feet, preferably about 1 to about 3 feet. The resin application process is carried out in the absence of pressure applied to the web opposite the area of resin transfer from the applicator to the web. In certain conventional resin application processes, such pressure is applied by a backup roll contacting the web surface (or a release sheet in contact with the web surface) opposite the surface through which resin is being applied. In the invention process, such applicator backup rolls are not necessary. The use of a release sheet is an option with the single-roll embodiment of the invention process, but is not necessary or, in general, desirable in the practice thereof.

The wetout of the web by the resin is achieved partially by pressure-driven flow at the applicator roll 4, but mainly by capillary action within the web. The capillary-induced flow of resin into the web depends upon the viscosity and surface tension of the resin as well as the porosity of the web and surface tension of the web fibers. For impregnation of conventional glass web styles, resin formulations having viscosities within the range of about 0.5 to about 6 poise, typically about one poise, and resin surface tension within the range of about 25 to about 40, typically about 32 dynes/cm, can be used. Resin infusion times will vary from about 0.1 second to 0.5 second under typical conditions. For a web speed of 200 ft/min (65 m/min), for example, the web will move approximately 1.6 ft (0.5 m) in 0.5 seconds. Therefore, to ensure complete wetting of the web before it reaches the second applicator roll 12, at web speeds of the order of 200 ft/min, the second applicator roll 12 will typically be positioned so that the points of web contact at applicator rollers 4 and 12 are approximately 2 ft (0.7 m) apart. Of course, modification of the process conditions and resin characteristics will require modification of the applicator specifications, including the distance between applicator rolls.

Figure 2:
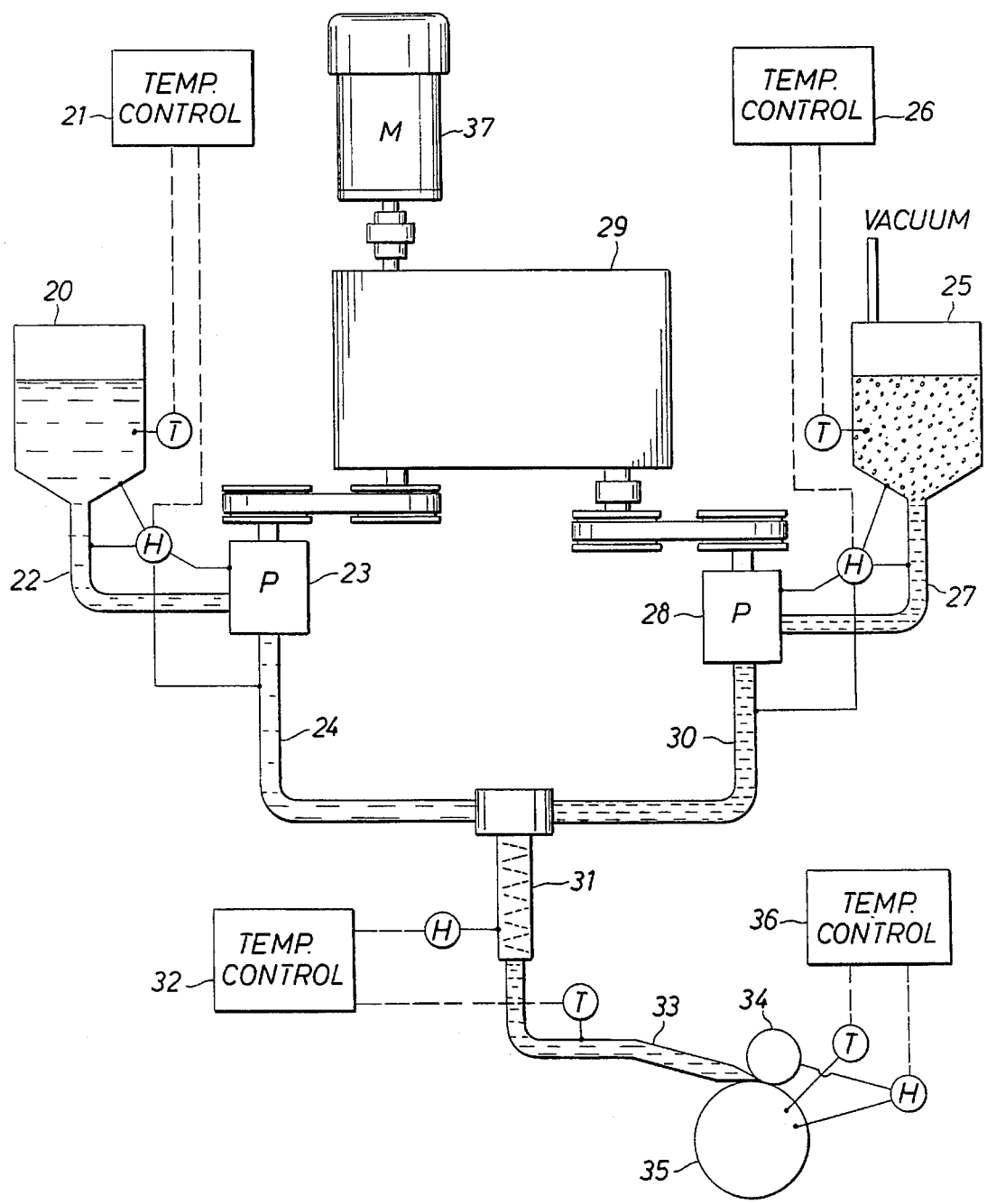
FIG. 2 is a schematic drawing of a resin delivery system designed for use with the invention process.

Resin delivery means designed for use in the invention resin application process and apparatus can be described with reference to FIG. 2. Resin from reservoir 20 maintained, by optional temperature control means 21, at a predetermined viscosity is passed via conduit 22, pump 23 and conduit 24 to mixing means 31, shown here as a static blender with internal blending baffles. Control system 29 delivers the desired proportion of resin and curing agent to the mixer, which is coordinated with the line speed of the web through the resin application zone by variable speed electric drive system 37. Curing compound(s) in reservoir 25 maintained, by optional temperature control means 26, in liquid form are passed via conduit 27, pump 28 and conduit 30 to mixing means 31, wherein the resin component and the curing component are intimately mixed at a controlled temperature maintained by temperature control means 32. The mixed resin formulation passes via nozzle 33 to applicator roll 35 and set gap roll 34, shown here with associated temperature control means 36, of the resin application apparatus described above.

The prepregging process of the invention can be described in general terms by reference to FIG. 3. Fibrous web 43 is delivered to resin application zone 44 by a suitable automated web advancement system 42 with means for measuring and controlling advancement speed and web tension. Web tension control devices are known in the art. For example, unwind roll 41 can include a brake which, in combination with a front-end dancer roll, maintains a preset web tension programmed into a pull-in unit located between the dancer roll and the resin application zone. Similarly, proper downstream web tension can be maintained by a dancer roll which moderates the speed of a variable-speed constant-diameter roll located downstream from the heating zone.

The fibrous web is advanced through resin application zone 44, which is here shown in the preferred generally vertical orientation, in which the web passes in a generally upward direction as liquid resin is applied by the method described in detail above. Application zone 44 includes resin delivery means, including a mixing portion for blending the resin and curing system, and temperature control as necessary to maintain the resin system at the desired viscosity.

Resin-saturated web 45 is advanced from the resin application zone to resin cure zone 46, typically a forced air heated treater, wherein the resin-saturated web is treated, by exposure to elevated temperature or UV radiation, for example, to partially cure the resin without gelation, a process known as "B-staging." The temperature in the treatment zone will vary depending upon the resin system and the degree of resin cure desired, but will generally be within the range of about 80° to about 200° C., preferably about 120° to about 180° C. The resin-saturated web will be subjected to the B-staging treatment for a time sufficient to impart the desired degree of cure, generally about 30 seconds to about 8 minutes. The web is advanced from resin treatment zone 46 in the form of a prepreg 47, which is rolled at uptake roll 48 for storage or, alternatively, is passed directly to lamination.

A laminate is fabricated by subjecting a set of layered prepregs to conditions effective to cure the resin and to integrate the prepregs into a laminated structure. The laminate can optionally include one or more layers of a conductive material such as copper. Laminating conditions generally include a time of about 30 minutes to about 4 hours, preferably about 1 hour to about 2 hours, a temperature of about 160° C. to about 300° C., preferably about 170° C. to about 200° C. and a pressure of about 50 to about 500 psi. The laminate can optionally be "post-cured" by heating at a temperature of about 200° to about 230° C. at ambient pressure for about 1 to 6 hours to improve thermal properties.

Thermosettable resins which can be used in preparing electrical laminates include epoxy resins, imide resins, cyanate resins, propargyl ethers, and blends and reaction products thereof. The currently favored resins, because of their low cost and cured properties, are epoxy resins, alone or blended with another resin. Suitable epoxy resins for electrical laminates include glycidyl ethers of dihydric and polyhydric phenols. Exemplary diepoxy resins include those which are prepared by the base-catalyzed reaction of a bisphenol and an epichlorohydrin and can be represented by formula I:

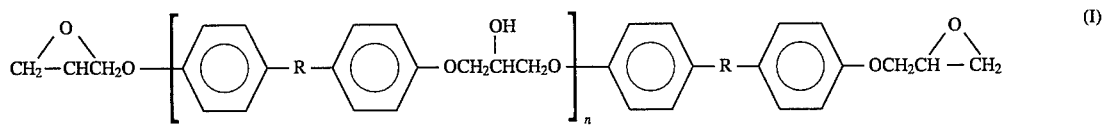

in which n is zero or a number greater than zero, commonly in the range of 0 to 10, preferably in the range of 0 to 2, and R is methylene or 2,2-propylene. An example of a suitable epoxy resin component is EPON® Resin 1123, a brominated diglycidyl ether of bisphenol-A having a molecular weight of about 800. Also suitable as the epoxy resin component are multifunctional glycidyl ethers of the tetraphenol of ethane, as represented below in structure II. Such multifunctional epoxy

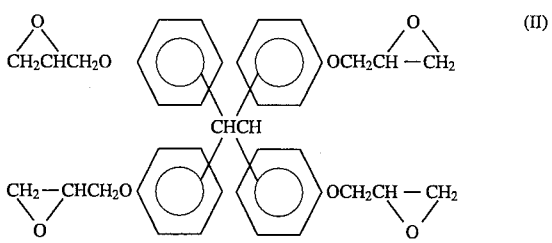

resins are available commercially as EPON® Resin 1031 from Shell Chemical Company. Other suitable resins can be prepared by the reaction of epichlorohydrin with mononuclear di- and trihydroxy phenolic compounds such as resorcinol and phloroglucinol, selected polynuclear polyhydroxy phenolic compounds such as bis(p-hydroxyphenyl)methane and 4,4'-dihydroxybiphenyl, or aliphatic polyols such a 1,4-butanediol and glycerol.

The epoxy resin component of the composite can also be novolac-based epoxy resins ("novolac epoxy resins"), which are the glycidyl ethers of the product of reacting a phenol, such as phenol, cresol, resorcinol or bisphenol-A, with formaldehyde in acid solution. An example of a suitable class of bisphenol-A novolac epoxy resins is represented below in structure III.

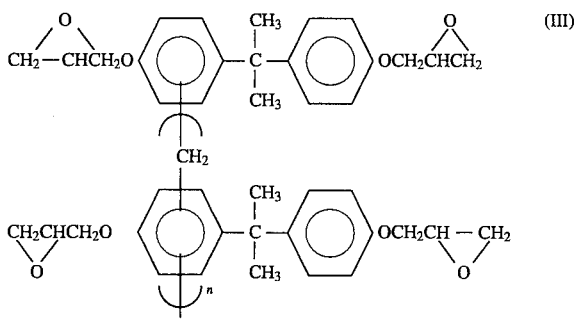

Other thermosettable resins, alone and in combination with epoxy resins, can be processed into laminates by the invention process. Such thermosettable resins include, for example, cyanate esters, propargyl ethers, and vinyl esters, and blends of such resins with epoxy resins. Highly suitable thermosettable resins for electrical applications include imides such as bismaleimides and trismaleimides. Preferred bismaleimides include N,N'-bisimides of unsaturated carboxylic acids which can be represented by the formula

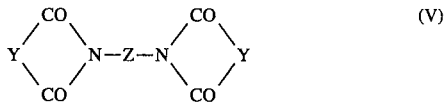

in which Y is a substituted or unsubstituted divalent radical containing at least 2 carbon atoms, preferably 2 to 6 carbon atoms, and a carbon-carbon double bond, and Z is a divalent radical containing at least 1, generally about 1 to about 40 carbon atoms. Z can be aliphatic, cycloaliphatic, aromatic or heterocyclic. A preferred class of bismaleimides is derived from an aromatic diamine and can be represented by the formula

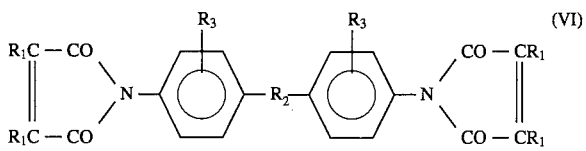

in which each $R_1$ is selected independently from H, $C_{1-2}$ alkyl or halide; $R_2$ is selected from divalent hydrocarbon radicals containing from about 1 to about 6 carbon atoms, —O—, —$SO_2$—, —COO—, —CONH—, —CO— and —S—S—; and each $R_3$ is selected independently from H, $C_{1-3}$ alkyl and halide.

Examples of such bismaleimides include
N,N'-4,4'-methylene-bismaleimide
N,N'-4,4'-ethylene-bismaleimide
N,N'-hexamethylene-bismaleimide
N,N'-meta-phenylene-bismaleimide
N,N'-p-phenylene-bismaleimide
N,N'-4,4'-diphenylmethane bismaleimide
N,N'-4,4'-diphenylether bismaleimide
N,N'-4,4'-diphenylsulphone bismaleimide
N,N'-4,4'-dicyclohexylmethane bismaleimide
N,N -4,4'-(3,5-diphenylpyridine) bismaleimide
N,N -pyridinidi-2,6-Y bismaleimide
N,N -α,α'-4,4'-dimethylenecyclohexane bismaleimide
N,N -meta-xylelene bismaleimide
N,N -4,4'-diphenylcyclohexane bismaleimide
N,N -meta-phenylene bisdichloromaleimide
N,N -4,4'-diphenylmethane biscitraconimide
N,N -4,4'-(1,1-diphenylpropane) bismaleimide
N,N'-4,4'-(1,1,1-triphenylethane) bismaleimide
N,N'-4,4'-triphenylmethane bismaleimide
N,N'-3,5-(1,2,4-triazole) bismaleimide,
and various N,N'-bismaleimides disclosed in U.S. Pat. Nos. 3,562,223, 4,211,860 and 4,211,861. Bismaleimides can be prepared by methods known in the art, such as described in U.S. Pat. No. 3,018,290, for example. The imide can also be a trifunctional maleimide reaction product of a bis(aminobenzyl)aniline with maleic anhydride. For laminating applications, the imide will preferably be blended with an epoxy resin in an amount within the weight ratios of 1:9 to 9:1, preferably about 1:1 to about 9:1.

An epoxy resin-containing laminating composition will include a curing agent. Effective curing agents for epoxy resins are known to include, for example, amines, acids, anhydrides, phenols and imidazoles. The presently-preferred curing agents for imparting optimum laminating properties to epoxy compositions are phenolic compounds which have a phenolic functionality greater than about 1.75. The preferred phenolic curing agents are phenolic novolacs prepared by reacting a dihydroxy phenol -such as resorcinol or bisphenol-A with formaldehyde in acid solution. The preferred phenolic novolac resin curing agents are bisphenol-A novolacs having a weight per phenolic group of about 60 to about 500, preferably about 60 to about 300, and, on the average, more than about 2 phenolic hydroxyl groups per molecule, preferably about 3 to about 5. Such phenolic novolacs are available under the tradename Epikure® DX-175 from Shell International Chemical Company. The phenolic novolac curing agent will be present in the composition in an amount effective to cure the epoxy resin, which will generally be a stoichiometric amount of about 0.75 to about 1.25 equivalents per equivalent of epoxy resin. In terms of weight percent, the curing agent will be present in an amount generally from about 10 to about 70 weight percent, preferably about 15 to about 50, most preferably about 15 to about 40, based on the combined weight of epoxy resin and curing agent.

The curing agent, for flame-proof applications, can be a mixture of the phenolic resin curing agent and a brominated phenolic curing agent. The brominated phenolic curing agent can be any monomeric or polymeric compound having at least one free phenolic hydroxyl group and one or more bromine atoms on the aromatic ring. Examples of suitable brominated phenolic curing agents include brominated bisphenol-A novolac, brominated phenolic novolac, brominated polyphenylene oxide, brominated bisphenol-A and brominated bisphenol-A carbonate, for example. The brominated bisphenol-A will be present in an amount effective to increase flame retardancy, generally an amount up to about 40 weight percent, usually about 2 to about 15 weight percent, based on the combined weight of epoxy resin and curing agent(s).

In order to promote faster and/or lower temperature cure of the resin components of the composition, an optional cure accelerator may be used. Many suitable accelerators, such as ureas, tertiary amines, imidazoles, phosphenes, octoates and boron trifluorides, for example, are known in the art. The presently preferred class is imidazoles such as 1-methyl imidazole, 2-ethyl imidazole, 2-methyl imidazole, 2-methyl-4-ethyl imidazole and isopropyl imidazole. Because of its availability and performance characteristics, 2-methyl imidazole is the preferred accelerator. The accelerator will be present in the composition in an amount effective to increase the cure rate and/or lower the cure temperature of the composition, generally in an amount from about 0.01 to about 7, preferably from about 0.05 to about 3 weight percent, based on the weight of the composition.

The thermosettable resin system must be designed within certain specifications dictated by the resin application process parameters. The resin formulation must be a liquid at a temperature at which the resin does not undergo cure over the time necessary for application of the resin to the substrate. The resin system must be of sufficiently low viscosity that it achieves good "wetout," or saturation of the web, without the use of a backup roll at the point of application. Once applied to the substrate, however, the resin system must have sufficient viscosity that it does not drop from the resin-containing web before it reaches the heating zone. Resin formulations having viscosities in the range of about 1 to about 10 poise, preferably about 1 to about 6 poise, are most suitable. The currently preferred resin system is a blend of a diglycidyl ether of bisphenol-A having a WPE of about 175–185, a brominated diglycidyl ether of bisphenol-A having a WPE of about 310–350 and a bromine content of about 30–50%, a phenolic novolac curing agent, and 2-methylimidazole accelerator.

The process of the invention can optionally be practiced with a thermosettable resin formulation which includes an organic solvent or diluent present in an amount effective to decrease the viscosity of the system for ease of processing. Polar organic solvents such as ketones, alcohols and glycol ethers, for example, are suitable. The chosen solvent will generally have a boiling point less than about 160° C. The preferred solvents for epoxy resins are ketones such as acetone, methyl ethyl ketone and methyl isobutyl ketone, for example, and solvent mixtures of these with an alkylene glycol ether such as propylene glycol monomethyl ether. The proportion of solid components in the composition can vary widely depending upon the amount of the other constituents present and the intended application of the composition, but the solvent in a solvent-borne system will generally constitute from about 15 to about 50 weight percent of the total weight of the formulation.

EXAMPLE 1

This example describes the preparation and testing of a solventless theremosettable resin system to determine its suitability for use in the invention prepreg preparation process. The resin component was prepared by charging 41.003 g brominated diglycidyl ether of bisphenol-A and 58.997 g liquid diglycidyl ether of bisphenol-A (WPE 178-186) to a heating vessel and stirring under nitrogen at 120° C. for 30 minutes. The curing agent component was prepared by heating 98.271 g of a phenol-formaldehyde novolac (HRJ-1166 from Schenectady Chemicals, WPP 103-105) to 120° C., adding 1.729 g of 2-methyl imidazole, and mixing at 120° C. for 30 minutes. The resin formulation was prepared by blending the resin component and the curing agent component in a weight ratio of 72:28.

A laminate was prepared under laboratory conditions simulating conditions of resin delivery and application to a glass web to confirm that the viscosity and cure characteristics of the resin formulation met processing requirements for the invention resin application technique. The viscosity of the above blend at 100° C. was about 9 poise. The blend was mixed at this temperature for 3 seconds to simulate mixing in an extruder barrel. The resulting blend had a gel time (measured at 140° C.) of 89 seconds and a viscosity at 120° C. of 6 poise. After mixing at 120° C. for 3 seconds to simulate one-side web application, the gel time (140° C.) was 85 seconds. The blend was applied by a hand squeeze-rolling technique to woven glass (style BFG 7628) and partially cured in an oven for 2 minutes at 163° C. for simulation of a conventional treater oven B-staging operation. The dust gel of the B-staged resin (140° C.) was 40 seconds, confirming advancement of the resin.

A prepreg produced in this manner was made into an eight-ply laminate by pressing at a pressure of 200 psi and holding at a temperature of 347° F. Heat-up and cool-down rate for this operation were maintained at 25° F./min. The laminate had the following properties:

| | |
|---|---|
| Flexural strength (23° C., psi) | 72,000 |
| Flexural modulus (23° C., psi) | 3,550,000 |
| Tg (°C., DSC) | 152 |
| Dielectric constant (23° C., D-24/23) | 4.47 |
| Volume resistivity ($\times 10^{13}$ ohm-cm) | 290 |
| Water absorption (1 hr 15 psi steam, % w) | 0.22 |
| Copper peel (1 oz, Cu, lbs/in) | 8.7 |
| Flammability UL-94 | VO |

EXAMPLE 2

This example demonstrates application of a solventless resin system to a glass web using the invention process on a laboratory scale. A single-side coater was constructed using an adjustable experimental coating apparatus. The applicator roll diameter was 8 inches. A 1-inch Meyer rod was used to define a gap through which the resin was metered prior to contact with the web. The applicator roll was rotated at a surface speed of 8 ft/min, and the Meyer rod was rotated at 1 ft/min. The applicator roll surface was heated to 120° C. A flexible, porous woven glass fabric web (1080 glass style) 18 inches in width was fed to the roller at a rate of 10 ft/min. The resin formulation described in Example 1 was deposited onto the applicator roll using a hot-melt dispensing pump operating at 100° C. Resin was applied to the cloth to provide a resin content of 67% wt. The resin-containing web was passed through a 15-foot oven maintained at 140° C. to B-stage the resin. The dust gel (measured at 171° C.) for B-staged resin removed from the prepreg was 34 seconds. The prepreg was used to make a 16-ply laminate by pressing at the following conditions:

| | |
|---|---|
| rate of rise (deg F./min) | 5 |
| maximum temperature (°F.) | 347 |
| pressure (psi) | 100 |
| time at temperature (hrs) | 1 |
| cooldown rate (°F./min) | 40 |
| The laminate had the following properties: | |
| Flexural strength | 53,271 |
| Flexural modulus | 2,098,000 |
| Tg | 135 |
| Volume resistivity | 240 |
| Laminate appearance | clear, uniform, good adhesion to glass, some voids |

We claim:

1. A process for preparing a prepreg comprising a glass-reinforced thermosettable resin, the process comprising:

(a) depositing a liquid-form, solventless thermosettable resin formulation comprising an essentially uncured epoxy resin onto the surface of a rotating roller;

(b) passing a porous glass web having first and second web surfaces in countercurrent contact with said resin formulation on said rotating ft/min and a web tension within the range of about 1 to about 3 pounds roller at a web speed within the range of about 8 ft/min to about 200 per linear inch so as to transfer said resin formulation to the first surface of the glass web and thence to the interior thereof, said transfer being carried out in the absence of external pressure applied to the second web surface opposite the area of resin transfer to the first web surface; and (c) passing said resin-containing glass web to a cure zone and subjecting the web to conditions effective to partially cure the thermosettable resin.

2. The process of claim 1 in which the thermosettable resin formulation is deposited onto said rotating roller from nozzle means extending from a static mixer.

3. The process of claim 1 in which the thermosettable resin formulation is deposited onto said rotating roller from nozzle means extending from an extruder.

4. The process of claim 1 in which said rotating roller is maintained at a temperature within the range of about 50° to about 200° C.

5. The process of claim 1 which comprises heating the glass web prior to contact thereof with the thermosettable resin formulation.

6. The process of claim 1 which further comprises:

(a) providing a second roller in general upward vertical alignment with respect to said first roller, said second roller rotating in reverse direction with respect to said first roller;

(b) passing said resin-containing glass web from said first roller to said second roller so as to effect countercurrent contact between the second surface of the resin-containing glass web and the second roller, said contact effected in the absence of external pressure applied to the first web surface opposite the area of contact with said second surface.

7. The process of claim 6 which further comprises depositing onto the surface of said second roller a liquid-form, solventless thermosettable resin formulation comprising an epoxy resin and passing the second surface of said resin-containing glass web in countercurrent contact therewith so as to transfer the thermosettable resin thereto.

8. The process of claim 1 in which step (b) comprises forming the deposited resin into a film of metered thickness for contact with the porous glass web.

9. The process of claim 1 in which said rotating roller is rotating at a speed within the range of about 70 to about 125 percent of the speed of the web.

10. The process of claim 1 in which the porous glass web is passed in contact with the moving surface at a speed within the range of about 50 ft/min to about 150 ft/min.

11. The process of claim 1 in which the epoxy resin comprises a diglycidyl ether of bisphenol-A having a weight per epoxide within the range of about 175–185.

12. The process of claim 1 in which the thermosettable resin formulation further comprises at least one of an imide resin, a cyanate ester resin and a propargyl ether resin.

13. The process of claim 1 which further comprises passing the epoxy resin and a curing agent into a mixing chamber wherein said thermosettable resin and said curing agent are blended at an elevated temperature to form the liquid-form thermosettable resin formulation.

14. The process of claim 1 in which the rotating roller is maintained at a temperature effective to maintain the viscosity of the thermosettable resin within the range of about 0.5 to about 6 poise.

15. The process of claim 1 in which the web speed is within the range of about 50 to about 150 ft/min, the web tension is within the range of about 1.5 to about 2 pounds per linear inch, and the speed of rotation of the roller is within the range of about 90 to about 100 percent of the web speed.

16. The process of claim 1 which further comprises passing the resin-containing glass web to a second rotating roller and causing sufficient countercurrent contact between said second roller and the second surface of the resin-saturated web to smooth said second surface and to remove any excess resin therefrom.

* * * * *